United States Patent [19]

Hirabayashi et al.

[11] Patent Number: 5,144,169
[45] Date of Patent: Sep. 1, 1992

[54] OPERATIONAL AMPLIFIER CIRCUIT

[75] Inventors: Atsushi Hirabayashi, Tokyo; Kyoichi Murakami, Kanagawa; Kenji Komori, Tokyo; Masaaki Ishihara, Kanagawa, all of Japan

[73] Assignee: Sony Corporation, Tokyo, Japan

[21] Appl. No.: 759,927

[22] Filed: Sep. 13, 1991

[30] Foreign Application Priority Data

Sep. 19, 1990 [JP] Japan .................. 2-247334

[51] Int. Cl.$^5$ ........................ H03K 5/22; G06G 7/12; H03F 3/45
[52] U.S. Cl. .................... 307/490; 330/257; 307/355
[58] Field of Search ............ 307/490, 491, 494, 355, 307/360, 362; 330/255, 257

[56] References Cited

U.S. PATENT DOCUMENTS 4,868,429 9/1989 Wölber et al. .................. 307/540

OTHER PUBLICATIONS

IBM Technical Disclosure Bulletin, "Buffer Amplifier w/Ultra-Low Output Impedance", vol. 29, No. 6, Nov. 1986.

Primary Examiner—Stanley D. Miller
Assistant Examiner—Sinh N. Tran
Attorney, Agent, or Firm—Lewis H. Eslinger; Donald S. Dowden

[57] ABSTRACT

An operational amplifier circuit comprises a pair of emitter common transistors forming a differential amplifier circuit including a first conductivity type first and second transistors; a current mirror circuit including a second conductivity type third and fourth transistors having commonly connected bases and collectors which are connected with the first and second transistors, respectively and a second conductivity of fifth transistor having an emitter connected with the common bases and a base connected with the collector of the fourth transistor; and an output circuit including a second conductivity type sixth transistor having a base connected with the collector of the first transistor and a second conductivity type seventh transistor having a base connected with the emitter of the sixth transistor for outputting an output of the collector of the seventh transistor via a transistor buffer. The voltage between the collectors and the emitters of the first and second transistors of the emitter common transistor differential pair are equal to each other so that the current offset is reduced to improve the distortion factor characteristics.

4 Claims, 2 Drawing Sheets

OPERATIONAL AMPLIFIER CIRCUIT

BACKGROUND OF THE INVENTION

The present invention relates to an operational amplifier circuit, and in particular to an operational amplifier which is suitably used in integrated circuits.

Related Art

As an operational amplifier circuit used as an internal circuit of integrated circuits, a circuit shown in, for example, FIG. 3 has been known.

In FIG. 3, differential input signals on a pair of input terminals 51 and 52 are supplied to the bases of a pair of NPN type transistors 53 and 54 which form an emitter common transistor differential amplifier. A current mirror circuit comprising a diode 55 and a PNP type transistor 56 is connected with the collectors of the transistors 53 and 54. The collectors of the transistors 53 and 54 are connected with the cathode of the diode 55 and the collector of the transistor 56, respectively. A power source $V_{CC}$ is connected with the anode of the diode 55 and the emitter of the transistor 56. The common emitters of the transistors 53 and 54 are grounded via a constant current source 57. An output from the collector of the transistor 54 is fed to the base of an NPN type output transistor 58. The transistor 58 has a collector to which a voltage $V_{CC}$ is applied and an emitter which is connected with a constant current source 59. An output from the emitter of the transistor 58 is outputted from an output terminal 60.

When the input signals applied upon the input terminals 51 and 52 are identical, that is, the differential input is zero, the currents flowing through both transistors 53 and 54 which form an input transistor differential pair have to be identical. If the collector voltages of the transistors 53 and 54 are different from each other so that their collector-emitter voltages $V_{CE}$ are different, the currents flowing through the transistors 53 and 54 are different due to so-called Early effect. At this time, a so-called current offset appears on the output terminal, which may undesirably cause deterioration of distortion factor characteristics.

The present invention was made under such a circumstance.

It is an object of the present invention to provide an operational amplifier circuit having a low current offset and excellent distortion characteristics.

Summary of the Invention

In order to accomplish the above mentioned object, the present invention provides an operational amplifier circuit, comprising a pair of emitter common transistors forming a differential amplifier circuit including a first conductivity type first and second transistors; a current mirror circuit including a second conductivity type third and fourth transistors having commonly connected bases and collectors which are connected with the first and second transistors, respectively and a second conductivity type of fifth transistor having an emitter connected with the common bases and a base connected with the collector of the fourth transistor; and an output circuit including a second conductivity type sixth transistor having a base connected with the collector of the first transistor and a second conductivity type seventh transistor having a base connected with the emitter of the sixth transistor for outputting an output of the collector of the seventh transistor via a transistor buffer.

The collector of the second transistor forming the emitter common transistor differential pair is supplied with a voltage which is lowered from the power source voltage by the voltages between the bases and emitters of the fourth and fifth transistors. The collector of the first transistor forming an emitter common transistor differential pair is supplied with a voltage which is lowered from the power source voltage by the voltage between the bases and emitters of the sixth and seventh transistors. Accordingly, the voltages between the collectors and the emitters of the first and second transistors become equal so that any influence of the Early effect can be eliminated.

BRIEF DESCRIPTION OF THE INVENTION

Description of the Embodiment

Figure 1:
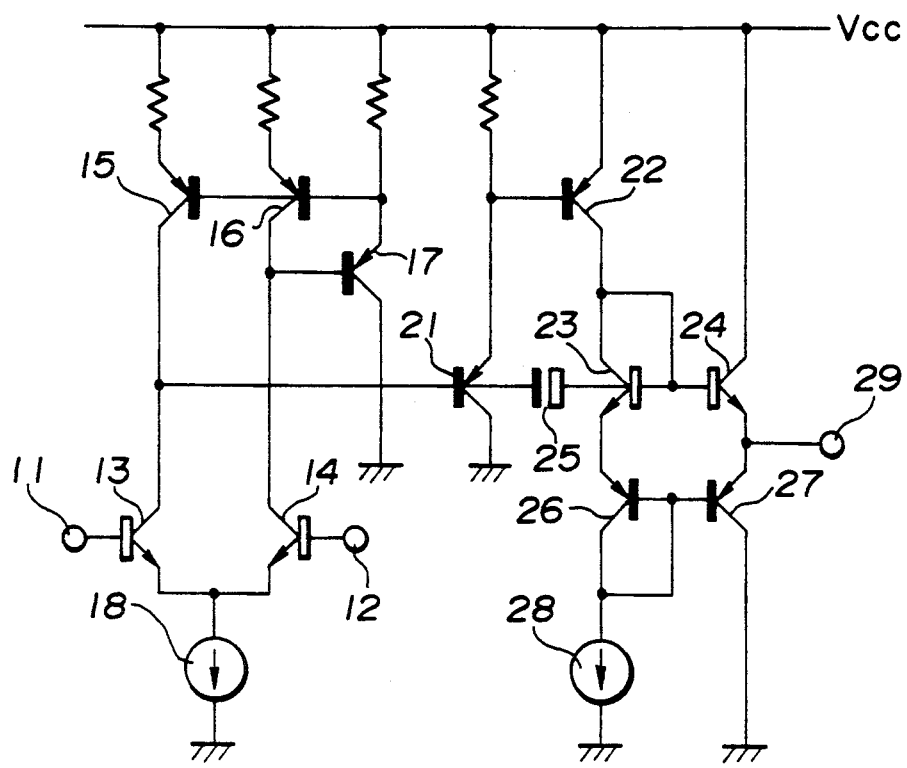
FIG. 1 is a circuit diagram showing the schematic structure of an embodiment of an operational amplifier circuit of the present invention.

Referring now to FIG. 1, there is shown a circuit diagram illustrating the schematic structure of an embodiment of an operational amplifier circuit of the present invention.

In the operational amplifier circuit shown in FIG. 1, input signals which are applied to a pair of differential input terminals 11 and 12 are supplied to respective bases of a first conductivity type, for example, NPN type transistors 13 and 14 which form an emitter common transistor differential pair. A current mirror circuit comprising a second conductivity type, for example, PNP type transistors 15, 16 and 17 are connected with the collectors of the transistors 13 and 14.

That is, the bases of the transistors 15 and 16 are commonly connected with each other and are connected with the emitter of the transistor 17 and the base of the transistor 17 is connected with the collector of the transistor 16 so that a current mirror circuit is formed. The collector of one transistor 13 of the transistor differential pair is connected with the collector of the transistor 15 while the collector of the other transistor 14 is connected with the collector of the transistor 16. These transistors 15, 16 and 17 are connected with a power source $V_{CC}$ via, for example, a resistor.

The collector of the transistor 13 is connected with the base of the second conductivity type, for example, PNP type transistor 21. The emitter of the transistor 21 is connected with the second conductivity type, for example, PNP type transistor 22. The collector of the transistor 22 is connected with the collector (the anode connected with the base) of, for example, an NPN type and diode connected transistor which forms a current mirror circuit serving as an output buffer. The base (anode) of the transistor 23 is connected with the base of, for example, an NPN type transistor 24. The base of the transistor 21 is commonly connected with the transistors 23 and 24 via a capacitor 25. The emitter (cathode) of the transistor 23 is connected with the emitter (anode) of a diode connected, for example, PNP type transistor 26. The base of the transistor 26 is connected with the base (the cathode connected with the collector) of a, for example, PNP type transistor 27. The collector (cathode) of the transistor 26 is grounded via a constant current source 28. An output terminal 29 is provided at the connection between the emitters of the transistors 24 and 27. The emitter of the transistor 21 is connected with the $V_{CC}$ power source $V_{CC}$ via, for example, a resistor. The emitter of the transistor 22 and the collector of the transistor 24 are directly connected with the power source $V_{CC}$. The input terminals 11 and 12 form non-inverting (+) and inverting (−) input terminals, respectively.

In the thus formed operational amplifier circuit, the transistor 17 of the current mirror circuit serves to cause the base current of the transistors 15 and 16 to flow for eliminating an error between the currents flowing across the emitters and collectors of the transistors 15 and 16. Accordingly, the collector voltage of the transistor 14 is substantially determined as a value which is obtained by the base-emitter voltages $V_E$ of the transistors 22 and 21 from the power source voltage $V_{CC}$ ($V_{CC}-2V_{BE}$). This causes the collector voltages of the transistors 13 and 14 forming an emitter common differential pair to be determined as $V_{CC}-2V_{BE}$. The emitters of the transistors 13 and 14 are commonly connected with each other so that they are at the same voltage. Accordingly, the collector-emitter voltages $V_{CE}$ of the transistors 13 and 14 will become substantially equal so that any influence of the Early effect can be eliminated. Such a circuit configuration can suppress a current offset to about several tens μV so that necessity for offset adjusting work is eliminated. The circuit is excellent in distortion factor characteristics.

Figure 2:
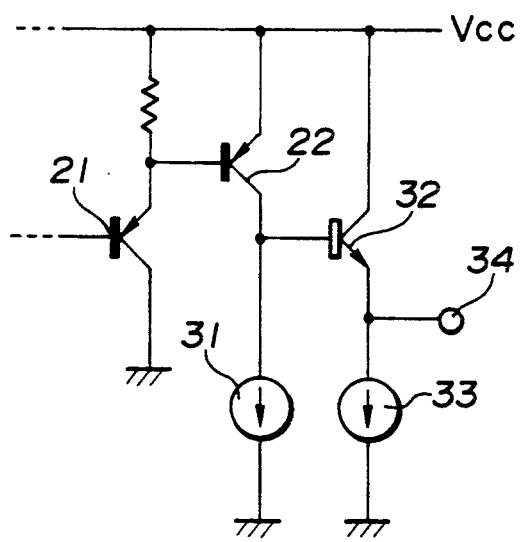
FIG. 2 is a circuit diagram showing a main part of the other embodiment of the present invention.
Figure 3:
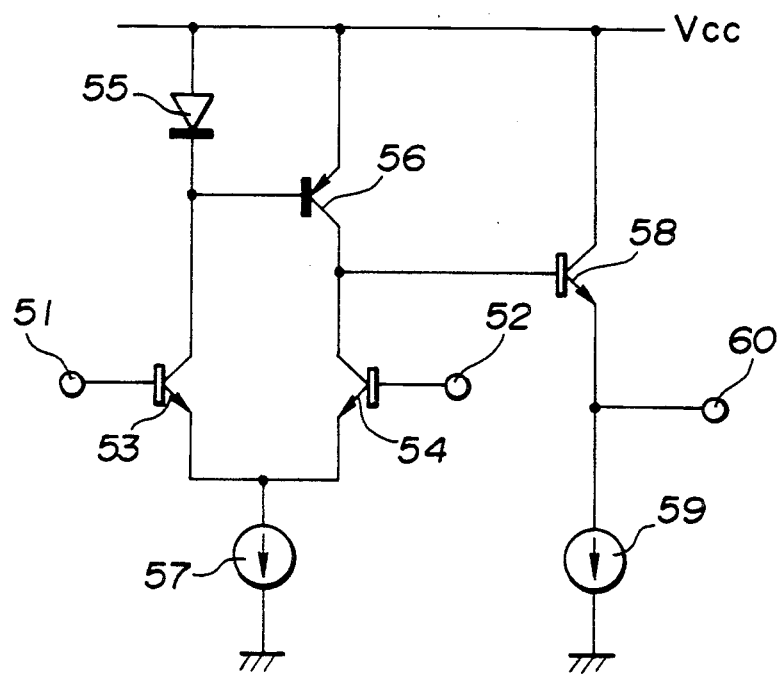
FIG. 3 is a circuit diagram showing prior art.

The present invention is not limited to the fore-going embodiment. For example, the output buffer circuit may be formed as shown in FIG. 2. Since the circuit from the input side to the transistors 21 and 22 in FIG. 2 may be identical with that in FIG. 1, illustration of the circuit is omitted. In the other embodiment shown in FIG. 2, the collector of a transistor 22 is grounded via a constant current source 31 and is connected with the base of a transistor 32. The emitter of the transistor 32 is grounded via a constant current source and is connected with an output terminal 34. The same effect as that of the embodiment of FIG. 1 can be obtained. Although the first and second conductivity types are NPN and PNP types, respectively for the transistors in the embodiments of FIGS. 1 and 2, the first and second conductivity types may be PNP and NPN types respectively. In other words, the circuit may be formed so that PNP and NPN type transistors in FIGS. 1 and 2 are replaced with NPN and PNP type transistors, respectively.

What is claimed is:

1. An operational amplifier circuit, comprising:
a pair of emitter common transistors forming a differential amplifier circuit including a first conductivity type first and second transistors;
a current mirror circuit including a second conductivity type third and fourth transistors having commonly connected bases and collectors which are connected with the first and second transistors, respectively, and a second conductivity type fifth transistor having an emitter connected with the common bases and a base connected with the collector of the fourth transistor; and
an output circuit including a second conductivity type sixth transistor having a base connected with the collector of the first transistor and a second conductivity type seventh transistor having a base connected with the emitter of the sixth transistor for outputting an output of the collector of the seventh transistor; wherein:
said output circuit further includes a first conductivity type diode-like-connected eighth transistor included in a second current mirror circuit and having a collector connected with the collector of the seventh transistor and a base connected with the base of a first conductivity type ninth transistor also included in the second current mirror circuit, the commonly connected bases of the eighth and ninth transistors being coupled with the base of the sixth transistor, the emitter of the eighth transistor being connected with the emitter of a second conductivity type and diode-like-connected tenth transistor, the base of the tenth transistor being connected with the base of a second conductivity type eleventh transistor, the collector of the tenth transistor being grounded via a constant current source so that an output is outputted from the connection between the emitters of the ninth and eleventh transistors.

2. An operational amplifier circuit as defined in claim 1 in which said output circuit is formed so that the collector of the seventh transistor is grounded via a first constant current source and is connected with the base of the first conductivity type eighth transistor and the emitter of the eighth transistor is grounded via a second constant current source so that an output is outputted from a connection between the emitter of the eighth transistor and the second constant current source.

3. An operational amplifier circuit as defined in claim 1 or 2 in which the first and second conductivity types are NPN and PNP types, respectively.

4. An operational amplifier circuit as defined in claim 1 or 2 in which the first and second conductivity types are PNP and NPN types, respectively.

* * * * *